United States Patent [19]
Takamoro et al.

[11] Patent Number: 5,933,061
[45] Date of Patent: Aug. 3, 1999

[54] CHIP-TYPE PIEZOELECTRIC FILTER AND FILTER CIRCUIT USING SUCH PIEZOELECTRIC FILTER

[75] Inventors: Kenji Takamoro, Tokyo; Tatsuo Ogawa, Kagamigahara; Takeshi Sugiyama, Ise, all of Japan

[73] Assignees: NEC Corporation; NGK Spark Plug Co., Ltd., both of Japan

[21] Appl. No.: 09/129,772

[22] Filed: Aug. 6, 1998

[30] Foreign Application Priority Data

Aug. 8, 1997 [JP] Japan ................................. 9-227296

[51] Int. Cl.⁶ .............................. H03H 9/48; H03H 9/60; H03H 9/10
[52] U.S. Cl. ......................... 333/189; 310/321; 310/348; 310/366; 333/187
[58] Field of Search ..................... 333/186–192, 333/101, 133; 310/321, 345, 348, 366, 340

[56] References Cited

U.S. PATENT DOCUMENTS

| | | | |
|---|---|---|---|
| 4,323,866 | 4/1982 | Inoue | 333/188 |
| 5,406,230 | 4/1995 | Yamamoto | 310/366 X |
| 5,504,980 | 4/1996 | Yoshinaga et al. | 310/366 X |

FOREIGN PATENT DOCUMENTS

| | | | |
|---|---|---|---|
| 0 449 300 | 10/1991 | European Pat. Off. | |
| 57-53118 | 3/1982 | Japan | 333/189 |
| 60-12810 | 1/1985 | Japan | 333/189 |
| 60-123122 | 7/1985 | Japan | |
| 63-1460 | 1/1988 | Japan | |
| 2-105712 | 4/1990 | Japan | |
| 3-97313 | 4/1991 | Japan | |
| 4-4603 | 1/1992 | Japan | 333/191 |
| 5-167386 | 7/1993 | Japan | 333/191 |
| 2 281 158 | 2/1995 | United Kingdom | |

*Primary Examiner*—Robert Pascal
*Assistant Examiner*—Barbara Summons
*Attorney, Agent, or Firm*—Larson & Taylor

[57] ABSTRACT

A multi-functional chip-type piezoelectric filter of a simple configuration comprises a multilayer structure which includes a plurality of piezoelectric substrates provided with oscillating sections having respective frequency response characteristics that are different from each other, a plurality of conductive terminals formed on the outer surface of the multilayer structure and connected to the respective oscillating sections of the piezoelectric substrates so that the oscillating sections may be selectively used.

12 Claims, 7 Drawing Sheets

CHIP-TYPE PIEZOELECTRIC FILTER AND FILTER CIRCUIT USING SUCH PIEZOELECTRIC FILTER

BACKGROUND OF THE INVENTION

1. Field of the Invention

The present invention relates to a chip-type piezoelectric filter comprising piezoelectric substrates, each having oscillating sections, and also to a filter circuit using such a piezoelectric filter.

2. Description of the Prior Art

Chip-type piezoelectric filters (or energy trapping type piezoelectric filters) are known and disclosed, inter alia, in Japanese Patent Kokai No. 3-97313 and Japanese Utility Model Publication No. 63-1460 and other patent documents.

Such a chip-type piezoelectric filter typically comprises a piezoelectric substrate, oppositely disposed input/output oscillation electrodes on one of the opposite surfaces of the piezoelectric substrate and a common oscillation electrode disposed on the other surface to cover said oscillation electrodes. Additionally, Japanese Patent Kokai Nos. 60-123122, 2-105712 and 4-4603 disclose an energy trapping type piezoelectric filter comprising a plurality of piezoelectric substrates that are arranged to form a multilayer structure. Various other arrangements of laying piezoelectric substrates to form a multilayer structure are also known. However, in any of these conventional multilayer structures, the electrodes disposed on the piezoelectric substrates are mutually connected according to a predetermined pattern to produce a single circuit.

In other words, they are not adapted to provide a multifunctional feature where one or more than one of the piezoelectric substrates are selectively used to make the piezoelectric filter operate for different functions or frequencies.

More specifically, a conventional piezoelectric filter typically comprises a single piezoelectric substrate and operates to allow only a given frequency to pass therethrough. Meanwhile, while various mobile telephone service systems including Portable Digital Cellular (PDC) Telephone System and Personal Handyphone System (PHS) are currently available, they are not compatible relative to each other and require users to use telephone sets particular to the respective service systems. Since each of these mobile telephone systems has its own advantages, there is a demand for a single portable telephone set that can be used for any of a number of different telephone service systems simply by selecting the desired system by means of a switch it has. Such a multi-applicability device may find a variety of applications other than the portable telephone set.

It is, therefore, an object of the present invention to provide a multi-function filter that meets such a demand, has a simple construction and is adapted to mass production.

Another object of the present invention is to provide a filter circuit using such a filter.

SUMMARY OF THE INVENTION

According to one aspect of the present invention, the above main object is achieved by providing a chip-type piezoelectric filter having a multilayer structure comprising:

a plurality of piezoelectric substrates, each having at least one oscillating section showing a frequency response characteristic different from each other for the respective piezoelectric substrates, each of the oscillating sections having a pair of input/output electrodes arranged on one surface of the associated piezoelectric substrate and a common electrode arranged on the other surface of the piezoelectric substrate, said oscillating sections being adapted to be selectively operated;

a plurality of pairs of input/output connection terminals provided on an outer peripheral surface of the multilayer structure, each pair of the input/output connection terminals being connected to the respective oscillating section; and a common connection terminal provided on the outer peripheral surface of the multilayer structure and connected to the common electrodes of the oscillating sections.

If each of the piezoelectric substrates has a plurality of oscillating sections, they do not necessarily have to show different frequency response characteristics.

Each piezoelectric substrate may be provided with semi-circular or quadrant notches at positions thereof where the input/output connection terminals and common connection terminal are to be disposed. Each of the notches may include a conductive layer for the respective connection terminal.

Also, the respective connection terminals may be provided with connector pins for mounting the filter on a printed circuit board.

Internal electric conduction patterns may be provided between the adjacent oscillating sections, which are arranged to form a capacitor section.

Preferably, a spacer substrate may be disposed between any two adjacent piezoelectric substrates in which each spacer substrate includes at least one opening each provided vis-a-vis the corresponding oscillating section.

Furthermore, a pair of cap substrates may be arranged respectively on the upper piezoelectric substrate and the lower piezoelectric substrate in which each cap substrate includes at least one recess each positioned vis-a-vis the corresponding oscillating section, and all the substrates have same dimensions.

With this arrangement, the electrically conductive layers formed on the piezoelectric substrates are protected by the cap substrates and the spacer substrate(s) to prevent short-circuiting from occurring. Additionally, the oscillating sections are prevented from being exposed to the outside along with other components and also from mutual contact by the recesses and the openings or windows formed respectively on the cap substrates and the spacer substrates to secure their proper oscillations.

According to another aspect of the present invention there is provided a chip-type piezoelectric filter having a multilayer structure comprising:

first and second piezoelectric substrates, each having at least one oscillating sections each showing a frequency response characteristic different from that or those of any of the other piezoelectric substrate, each of the oscillating sections in the first and second piezoelectric substrates having a pair of input/output electrodes arranged on one surface of each of the first and second piezoelectric substrate and a common electrode arranged on the other surface of the piezoelectric substrate;

a spacer substrate disposed between the first and second piezoelectric substrates and having at least one opening each located vis-a-vis the corresponding oscillating section;

a pair of cap substrates arranged respectively on the first and second piezoelectric substrates, each having at least one recess each of which is located vis-a-vis the corresponding oscillating section;

a first pair of input/output connection terminals provided on an outer peripheral surface of the multilayer structure and connected to the respective input/output electrodes on the first piezoelectric substrate;

a second pair of input/output connection terminals provided on an outer peripheral surface of the multilayer structure and connected to the respective input/output electrodes on the second piezoelectric substrate;

said first and second piezoelectric substrates being adapted to be selectively operated by way of the first and second paired input/output connection terminals, and a common connection terminal provided on the outer peripheral surface of the multilayer structure and connected to the common electrodes on the first and second piezoelectric substrates.

For the purpose of the invention, a selection/switching means may be arranged to selectively connect the paired input/output connection terminals connected to the oscillating section(s) of only one of the piezoelectric substrates and arranged on the outer peripheral surface of the multilayer structure to a given electric path in order to select only the oscillating section(s) of the piezoelectric substrate. The selected oscillating section(s) have a frequency response characteristic different from the remaining oscillating section(s) and hence only an electric wave having a predetermined frequency or a frequency band corresponding to the oscillating section(s) can be selected.

DETAILED DESCRIPTION OF THE INVENTION

The present invention will now be described with reference to the accompanying drawings that illustrate preferred embodiments of the chip-type piezoelectric filter according to the present invention.

Figure 1:
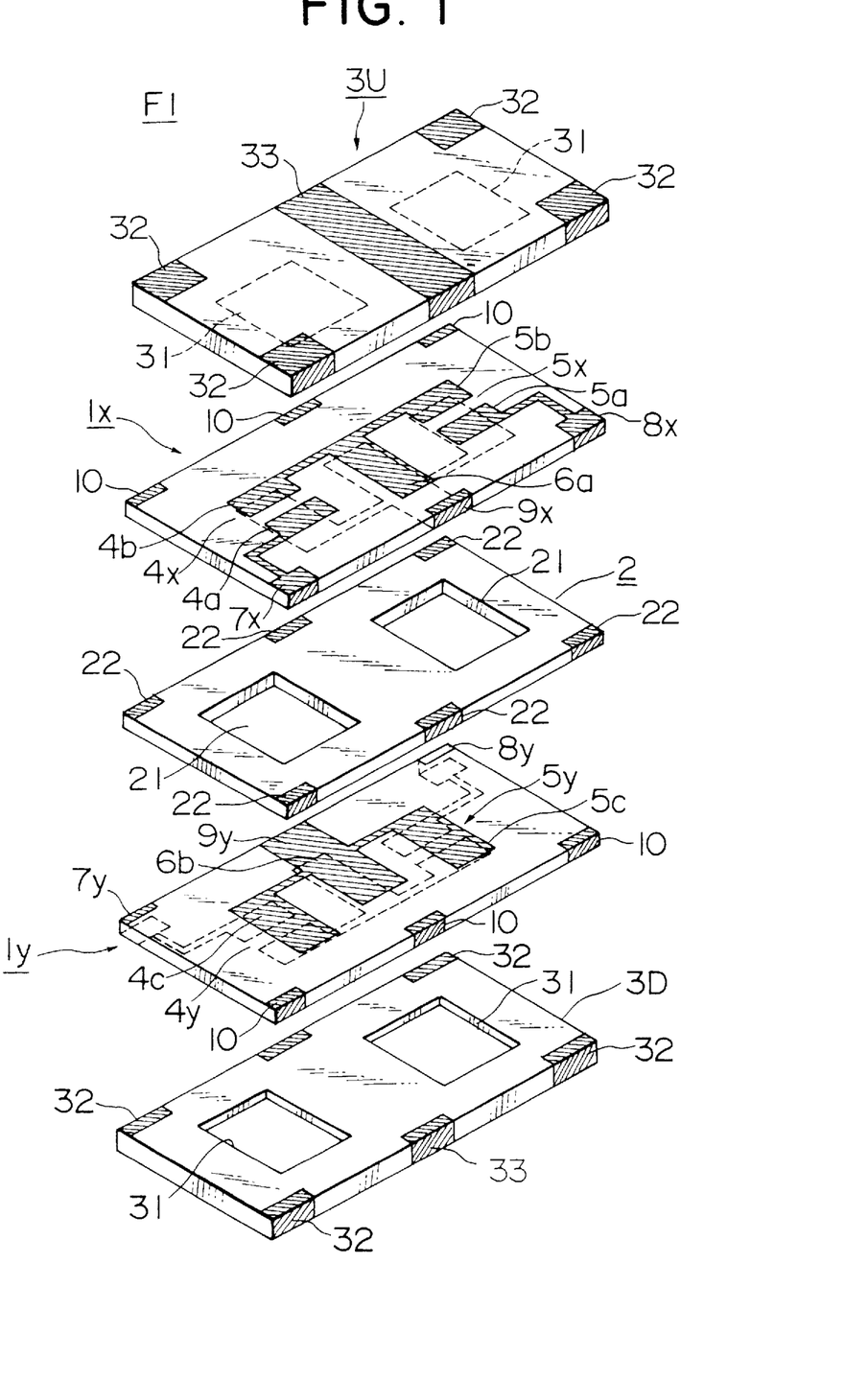
FIG. 1 is an exploded schematic perspective view showing an embodiment of chip-type piezoelectric filter according to the invention.

Referring firstly to FIG. 1, the chip-type piezoelectric filter F1 comprises a pair of piezoelectric substrates 1x and 1y, a spacer substrate 2 disposed between the piezoelectric substrates 1x and 1y and a pair of cap substrates 3U and 3D arranged outside the piezoelectric substrates 1x and 1y. These substrates are superimposed on each other to produce a multilayer structure.

Figure 2:
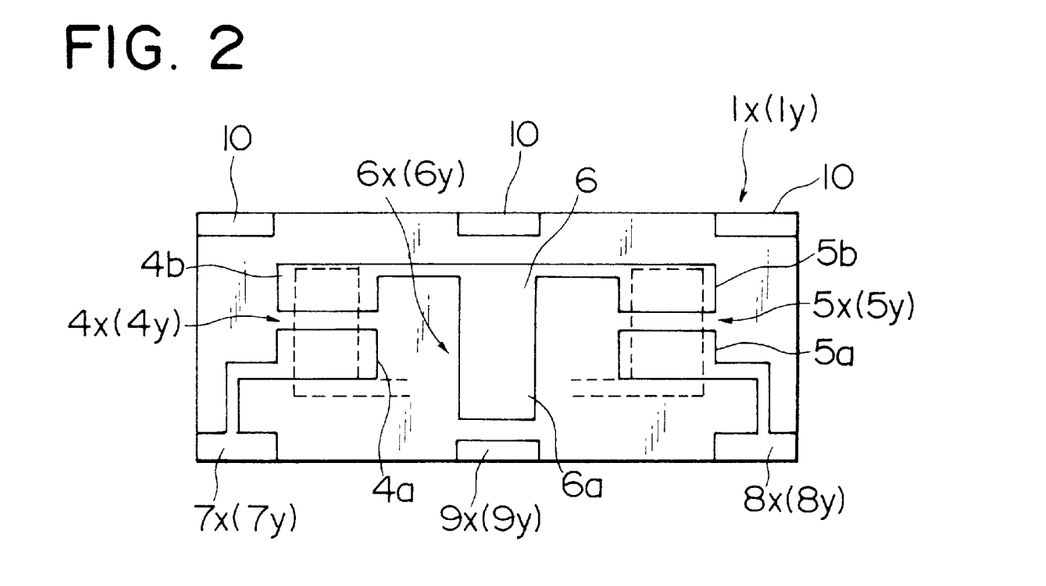
FIG. 2 is a schematic plan view of one of the piezoelectric substrates in the embodiment of FIG. 1, showing one side thereof.
Figure 3:
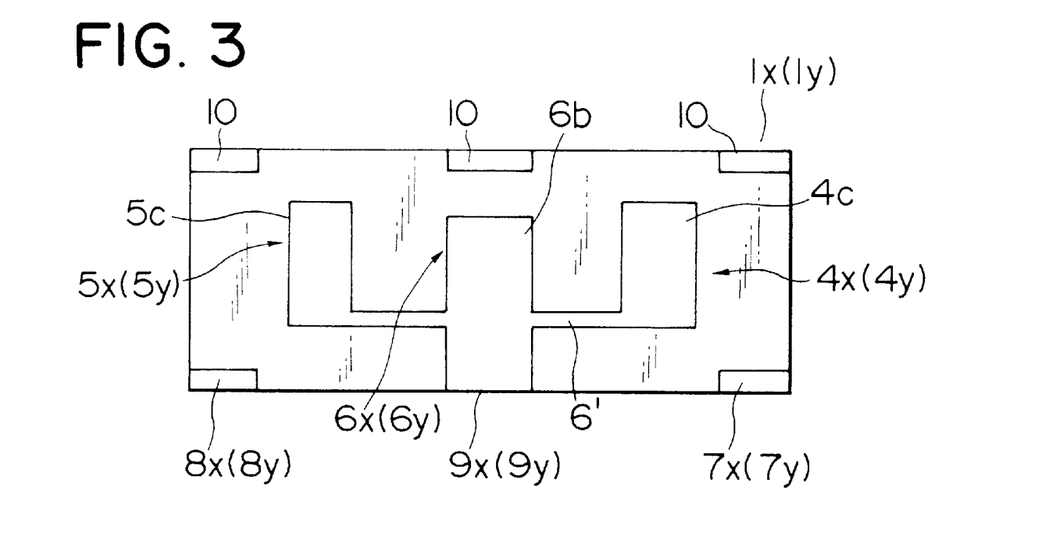
FIG. 3 is a schematic plan view of one of the piezoelectric substrates of the embodiment of FIG. 1, showing the other side thereof.

Referring now to FIGS. 2 and 3, each of the piezoelectric substrates 1x and 1y is made of a piezoelectric ceramic material such as $PbTiO_3$ or $PbTiO_3$—$PbZrO_3$ and is provided on one of the opposite surfaces thereof with a pair of laterally and oppositely disposed input/output oscillation electrodes 4a and 4b and another pair of laterally and oppositely disposed input/output oscillation electrodes 5a and 5b, said input/output oscillation electrodes being separated from each other. The input/output oscillation electrodes 4b, 5b are connected by an internal electric conduction pattern 6. The internal electric conduction pattern 6 has a capacitor electrode 6a extending centrally and longitudinally therefrom. The input/output oscillation electrodes 4a and 5a extends to the outer periphery at the respective closest corners to form first conduction terminals 7x and 8x or 7y and 8y. Each of the conduction terminals 7x, 8x, 7y and 8y extends further to the opposite surface of the piezoelectric substrate 1x or 1y, whichever appropriate, by way of the outer periphery thereof so that it may be electrically connected to the other layers of the multilayer structure.

Meanwhile, as shown in FIG. 2, each of the piezoelectric substrates 1x and 1y is provided on the opposite surface with common electrodes 4c and 5c disposed vis-a-vis the input/output oscillation electrodes 4a and 4b and the input/output oscillation electrodes 5a and 5b and extended over respective areas that entirely cover the oscillation electrodes and also with a capacitor electrode 6b disposed vis-a-vis the capacitor electrode 6a. The common electrodes 4c and 5c are connected to each other by another internal electric conduction pattern 6'. The capacitor electrodes 6b of the two piezoelectric substrates 1x and 1y extend at an end thereof to the respective opposite surfaces of the piezoelectric substrates 1x and 1y by way of the respective outer peripheries thereof to form common conduction terminals 9x and 9y respectively. The piezoelectric substrates 1x and 1y are additionally provided on the respective outer peripheries thereof with conductive connection terminals 10 at symmetrical positions relative to the conduction terminals 7x, 8x and 9x, and 7y, 8y and 9y.

Figure 11:
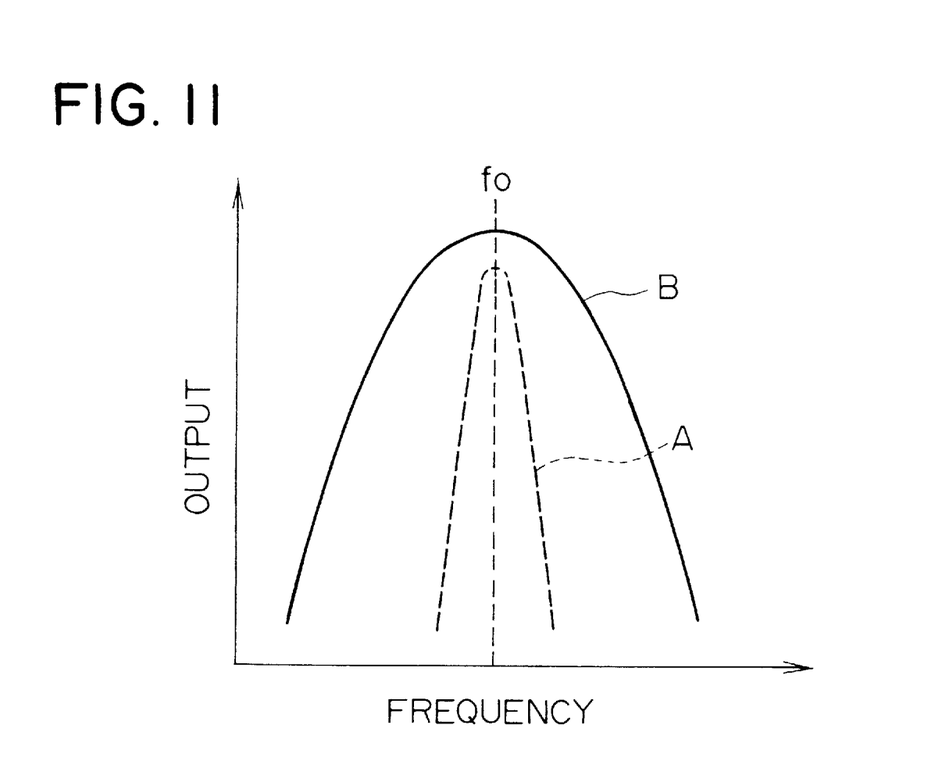
FIG. 11 is a graph showing the frequency response waveform A of Portable Digital Cellular (PDC) Telephone System and the frequency response waveform B of Personal Handyphone System (PHS) for the purpose of comparison.

With the above illustrated arrangement, each piezoelectric substrate 1x or 1y carries thereon the paired input/output oscillation electrodes 4a and 4b disposed vis-a-vis the common electrode 4c to form an oscillating section 4x or 4y and another pair of input/output oscillation electrodes 5a and 5b disposed vis-a-vis another common electrode 5c to form another oscillating section 5x or 5y. Also, the oppositely disposed capacitor electrodes 6a and 6b are intended to form a capacitor section 6x or 6y adapted to produce an electrostatic capacitance, the respective sections being connected to the first conduction terminals 7x and 8x, the second conduction terminals 7y and 8y and the common conduction terminals 9x and 9y, respectively. The oscillating sections 4x and 5x of the piezoelectric substrate 1x show a frequency response characteristic different from that of the oscillating sections 4y and 5y of the piezoelectric substrate 1y such that, for example, the piezoelectric substrate 1x has a frequency response characteristic good for a narrow frequency band width as shown by A in FIG. 11 and is adapted to Portable Digital Cellular (PDC) Telephone System, whereas the piezoelectric substrate 1y has a frequency response characteristic good for wide frequency band width as shown by B in FIG. 11 and is adapted to Personal Handyphone System (PHS).

As described above, the electrode sections of the piezoelectric substrates 1x and 1y have a same configuration. Therefore, one of the piezoelectric substrates is turned upside down as shown in FIG. 1 so that the conduction terminals 7x, 8x and 9x of the piezoelectric substrate 1x may be positionally displaced from the corresponding conduction terminals 7y, 8y and 9y of the piezoelectric substrate 1y, the conduction terminals 7x, 8x and 9x being located along a lateral edge opposite to the edge where the conduction terminals 7y, 8y and 9y are arranged. Thus, the conduction terminals 7x, 8x and 9x of the piezoelectric substrate 1x are aligned with the respective conductive connection terminals 10 of the other piezoelectric substrate 1y.

The spacer substrate 2 arranged between the piezoelectric substrates 1x and 1y is provided with a pair of rectangular windows or openings 21 which are located vis-a-vis the oscillating sections 4x, 5x and 4y, 5y, respectively so that it may not interfere with the oscillation of the oscillating sections 4x, 5x and 4y, 5y.

Additionally, the spacer substrate 2 is provided with a total of six conductive connection terminals 22 so that the conduction terminals 7x, 8x, 9x and the conductive connection terminals 10 of the piezoelectric substrate 1x and the conductive connection terminals 10 and the conduction terminals 7y, 8y, 9y of the piezoelectric substrate 1y are electrically connected to the respective conductive connection terminals 22.

Finally, the layers of the piezoelectric substrate 1x, the spacer substrate 2 and the piezoelectric substrate 1y are sandwiched by the top cap substrate 3U and the bottom cap substrate 3D. Each of the cap substrates 3U and 3D is provided with a pair of rectangular recesses 31 located vis-a-vis the oscillating sections 4x, 5x or 4y, 5y of the corresponding piezoelectric substrate 1x or 1y so that it may not interfere with the oscillation of the oscillating sections 4x, 5x or 4y, 5y, whichever appropriate. Each of the cap substrates 3U and 3D is also provided at the corners thereof with conductive connection terminals 32 to be connected with the conduction terminals 7x, 8x or 7y, 8y, whichever appropriate, the conductive connection terminals 32 extending to the opposite surfaces of the piezoelectric substrate by way of the outer periphery thereof, and at the middle thereof with a stripe-shaped conductive connection terminal 33 transversally crossing the outermost surface of the cap substrate.

Thus, the substrates 1x, 1y, 2, 3U and 3D form a multilayer structure, where the conduction terminals 7x, 8x, 7y, 8y are connected to the respective ones of the conductive connection terminals 10, 22, 32 that are vertically aligned with each other.

Figure 4:
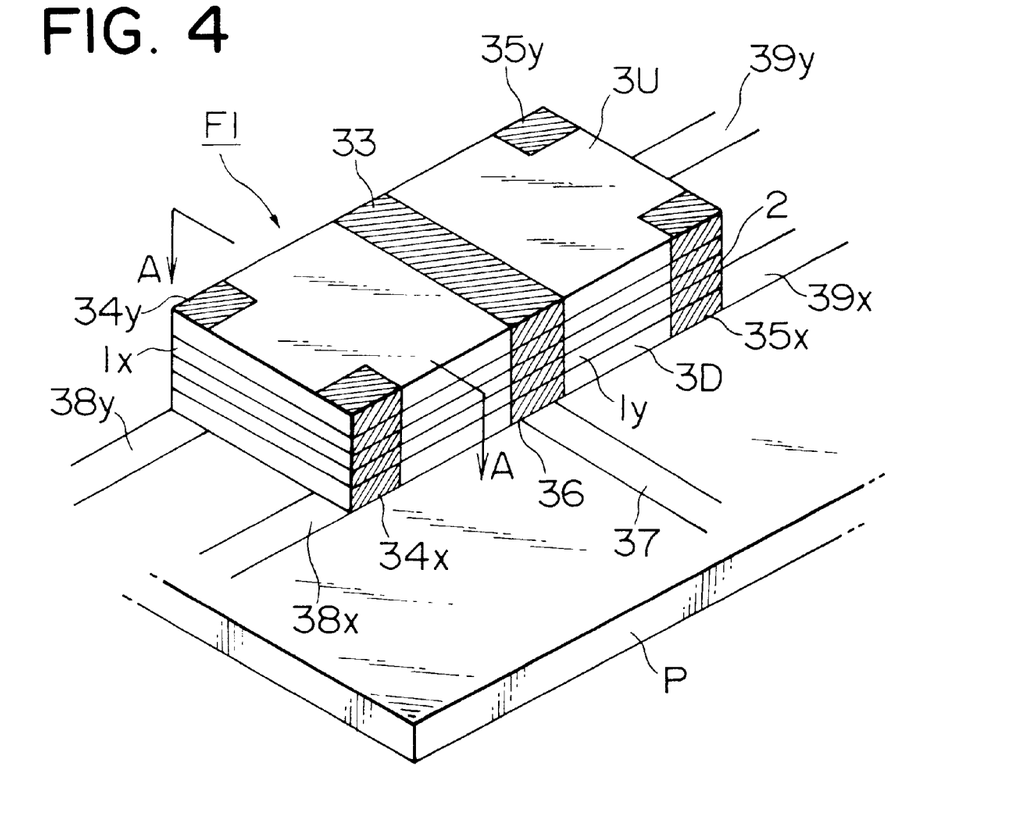
FIG. 4 is a schematic perspective view of the embodiment of the chip-type piezoelectric filter of FIG. 1, showing it as a multilayer entity.

On the surface of the multilayer structure are provided a pair of first input/output conduction terminal 34x and 35x, and a pair of second input/output conduction terminal 34y and 35y (see FIG. 4). The first input/output conduction terminals 34x and 35x are positioned at the opposite corners of a lateral side of the multilayer structure and connected to the piezoelectric substrate 1x. The second input/output conduction terminals 34y and 35y are positioned at the opposite corners of the opposite lateral side of the multilayer structure and connected to the piezoelectric substrate 1y. That is, one of the first input/output conduction terminals 34x is connected to the input/output oscillation electrode 4a of the oscillating section 4x by way of the first conduction terminal 7x, and the other first input/output conduction terminal 35x is connected to the input/output oscillation electrode 5a of the oscillating section 5x by way of the first conduction terminal 8x. One of the second input/output conduction terminal 34y is connected to the input/output oscillation electrode 4a of the oscillating section 4y by way of the second conduction terminal 7y, and the other second input/output conduction terminal 35y is connected to the input/output oscillation electrode 5a of the oscillating section 5y by way of the second conduction terminal 8y.

Further, a stripe-shaped common conduction terminal 36 is formed by the common conduction terminals 9x and 9y, and the conductive connection terminals 22 and 33 to surround the multilayer structure at the middle thereof. The common conduction terminal 36 is connected to the capacitor electrodes 6b of the piezoelectric substrates 1x and 1y.

Figure 5:
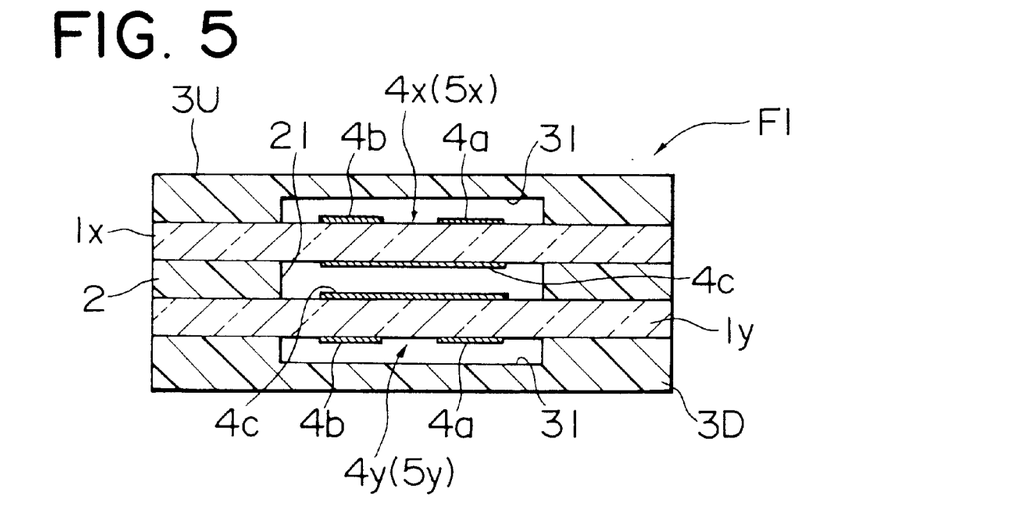
FIG. 5 is a schematic cross sectional view of the multilayer arrangement of FIG. 4, taken along line A—A.

Referring to FIG. 5, in the multilayer structure, each of the oscillating sections 4x, 5x and 4y, 5yhas a space either on the upper surface or on the lower surface so that their oscillations will not be obstructed. The capacitor section 6x or 6y is sandwiched by the spacer substrate 2 and the cap substrate 3U or 3D, whichever appropriate.

The chip-type piezoelectric filter F1 thus prepared is then directly mounted on a printed circuit board P as shown in FIG. 4 and the common conduction terminal 36 is connected to a common electric path 37 provided on the board P, while the input/output conduction terminals 34x, 35x and 34y, 35y are connected to electric paths 38x, 39x and 38y, 39y on the board P, respectively.

Figure 8:
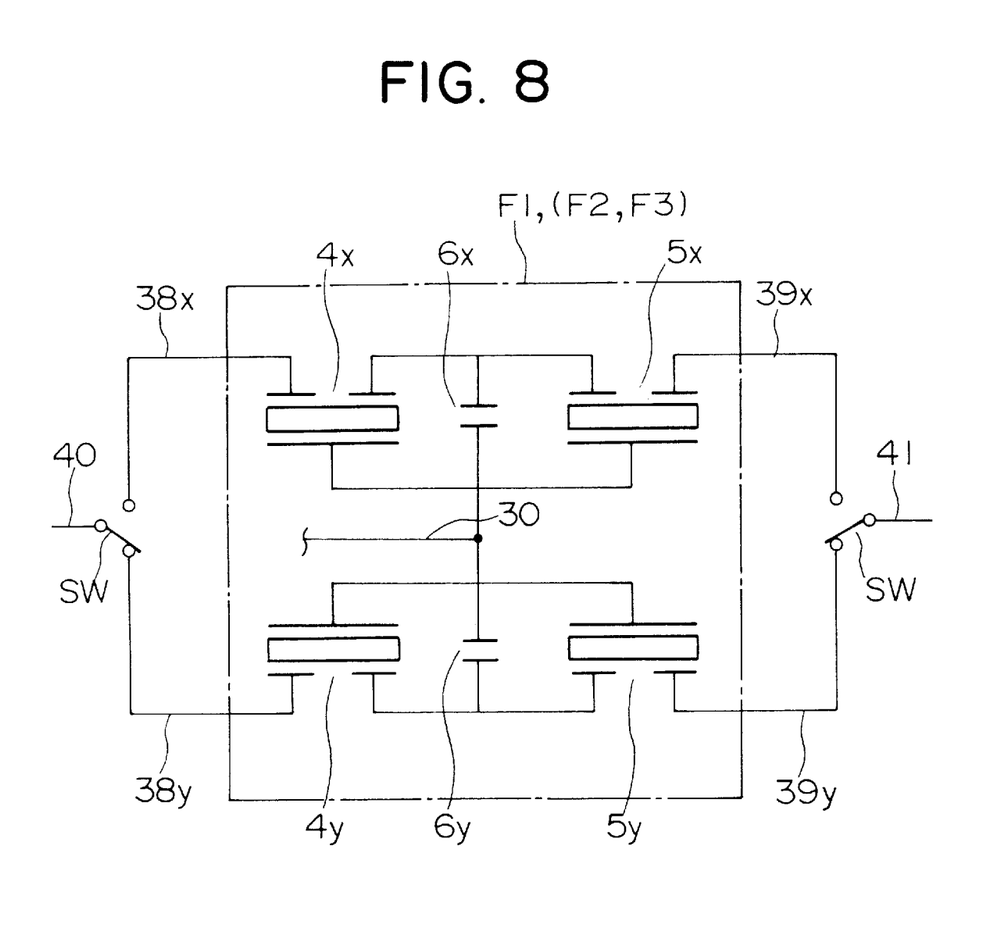
FIG. 8 is a schematic circuit diagram showing an equivalent circuit of the respective chip-type piezoelectric filter illustrated in FIGS. 1–7.

FIG. 8 shows a circuit diagram of an equivalent circuit of the illustrated chip-type piezoelectric filter F1.

Then, one of the input/output conduction terminals 34x and 34y and the corresponding one of the input/output conduction terminals 35x and 35y are selectively connected by a switching mechanism SW, which is a selection/switching means, so that only either the pair of first input/output conduction terminals 34x and 35x or the second input/output conduction terminals 34y and 35y are connected to the input/output lines 40 and 41. Thus, only one of the piezoelectric substrates 1x and 1y is activated by the switching mechanism SW.

Figure 6:
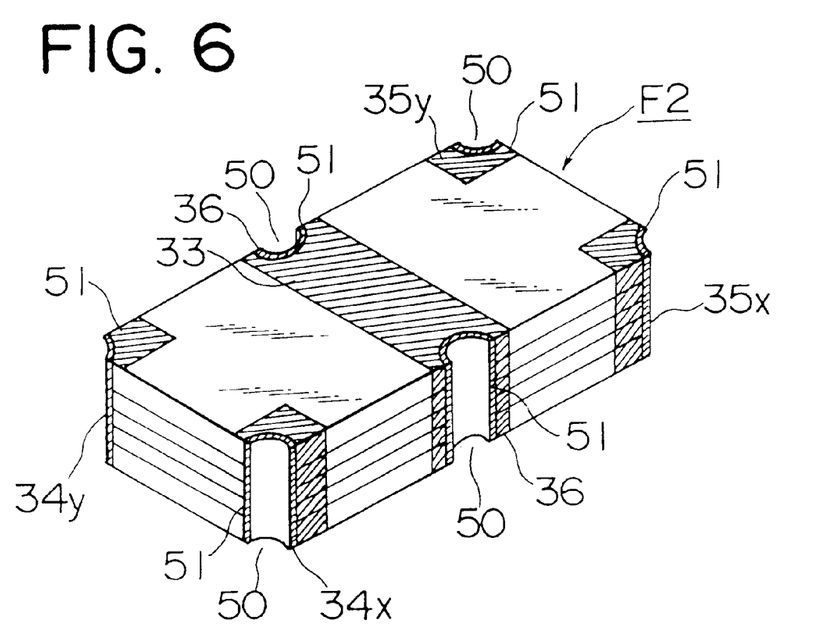
FIG. 6 is a schematic perspective view showing a modification of chip-type piezoelectric filter of FIGS. 15.

While the illustrated embodiment comprises input/output conduction terminals 34x, 35x, 34y, 35y and 36 configured in a manner as shown in FIG. 4, it may alternatively be modified in such a manner as shown in FIG. 6. In the modified chip-type piezoelectric filter F2, the substrates 1x and 1y are provided with circular notches at the positions of the conduction terminals to form communication grooves 50 on each of which an electrically conductive layer 51 is formed to ensure the operation of the input/output conduction terminals 34x, 35x, 34y, 35y and 36.

Each of the above mentioned and illustrated embodiments represent a surface-mounting chip-type piezoelectric filter F1 or F2.

Figure 7:
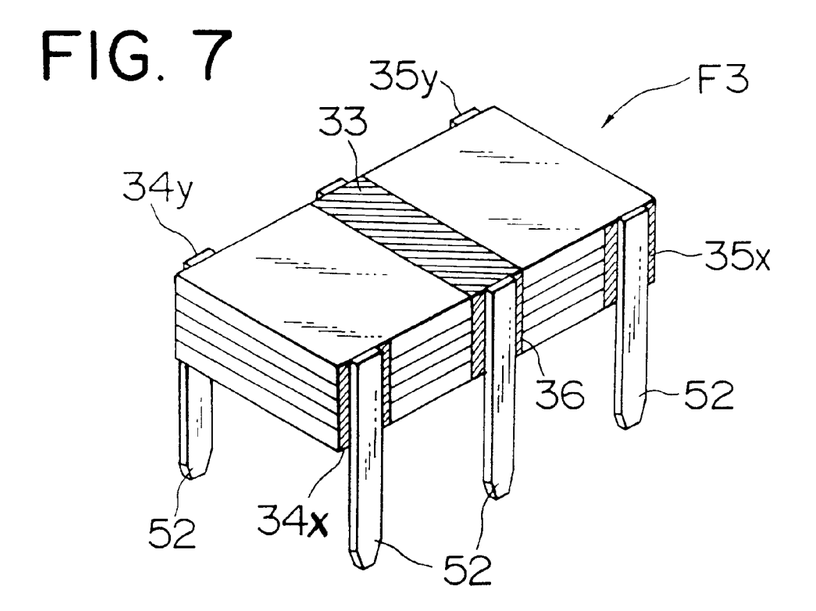
FIG. 7 is a schematic perspective view showing another modification of chip-type piezoelectric filter of FIGS. 1–5.

FIG. 7 illustrates another embodiment of the present invention. In the illustrated arrangement F3 connector pins 52 are securely fitted to the respective input/output conduction terminals 34x, 35x, 34y, 35y and 36 so that the latter may be connected to the corresponding electric paths on the surface of the printed circuit board P by way of the respective connector pins 52. The connector pins 52 may be appropriately bent for easy connection to the corresponding electric paths. Alternatively, they may be connected to the corresponding electric path by way of respective through holes arranged in the printed circuit board P.

Figure 9:
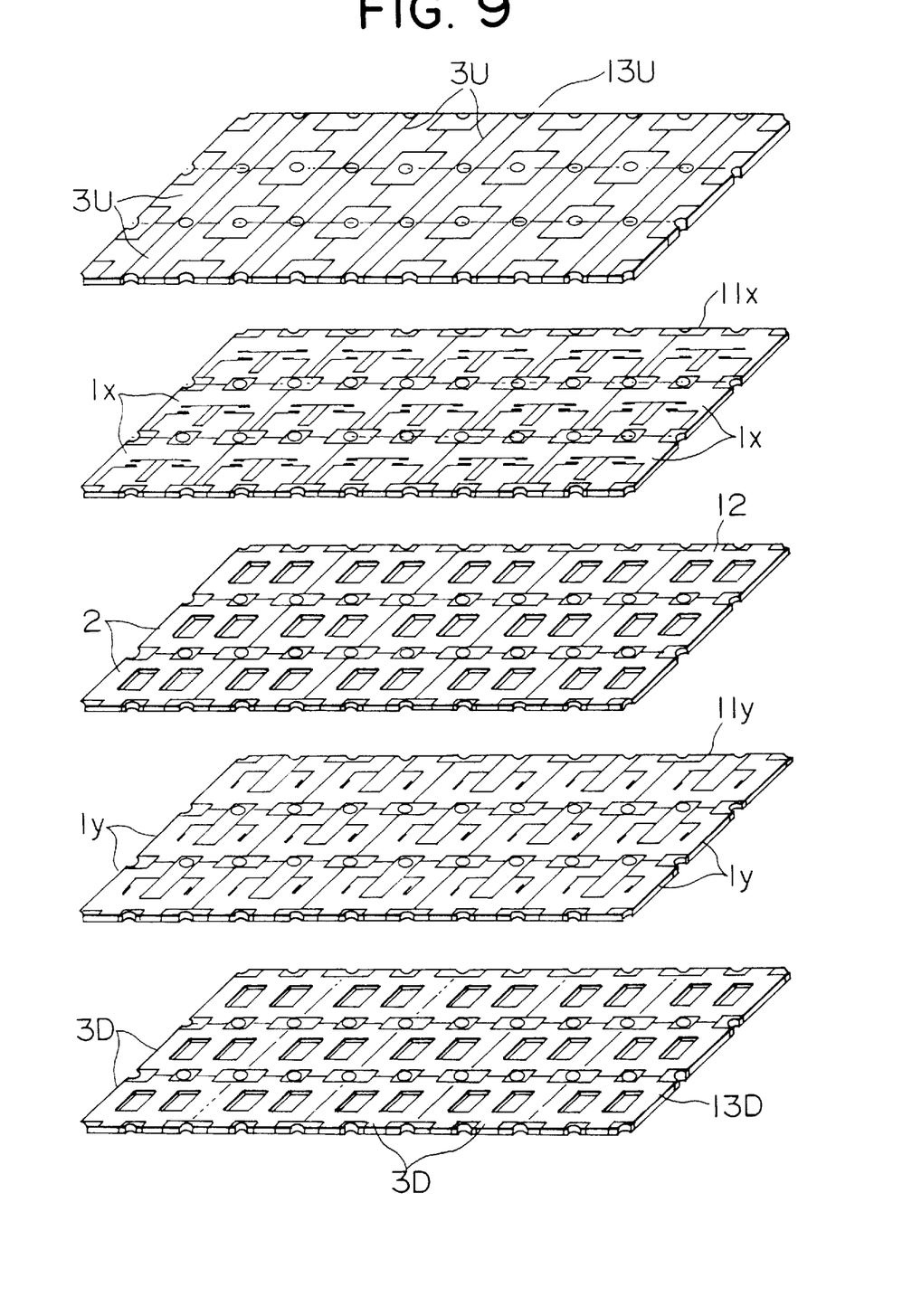
FIG. 9 is an exploded schematic perspective view showing integrated substrates which are to be used for manufacturing the chip-type piezoelectric filter according to the present invention.

Referring to FIG. 9, there is illustrated how chip-type piezoelectric filters such as the ones shown in FIG. 6 may be prepared. A large number of chip-type piezoelectric filters, each having a configuration as described above, may be manufactured by combining integrated substrates 11x and 11y having respective patterns for piezoelectric substrates 1x and 1y, an integrated substrate 12 having a pattern for spacer substrates 2 and integrated substrates 13U and 13D having respective patterns for cap substrates 3U and 3D and sequentially bonding these integrated substrates by means of an epoxy-type adhesive agent applied to the surfaces thereof except the electrically conductive layers to produce a multilayer structure.

Individual chip-type piezoelectric filters are produced by cutting the multilayer structure. The integrated substrates are provided with through holes for forming communication grooves 50.

Each of the integrated substrates is a very thin sheet of a piezoelectric ceramic material such as $PbTiO_3$ or $PbTiO_3$—$PbZrO_3$, which is baked and thereafter processed to produce the windows 21, the recesses 31 and other recesses by punching or molding. The processed substrates are then baked again and electrically conductive layers are formed thereon for the electrodes and the conduction terminals typically by means of silver evaporation deposition or screen printing. The electrically conductive layers to be formed in a subsequent step are typically produced by means of a metalizing process.

The use of such a multilayer structure comprising integrated substrates is advantageous because it can easily be manufactured on a mass production line and a large number of individual chip-type piezoelectric filters can be produced simply by cutting to appropriate dimensions. The produced chip-type piezoelectric filters are highly stable in terms of quality and performance.

In a chip-type piezoelectric filter produced in a manner as described above, the oscillating sections 4x and 5x of the piezoelectric substrate 1x shows a frequency response characteristic different from the oscillating sections 4y and 5y of the piezoelectric substrate 1y. For example, the oscillating sections 4x and 5x of the piezoelectric substrate 1x has a frequency response characteristic good for a narrow frequency band width as shown by A in FIG. 11 and is adapted to Portable Digital Cellular (PDC) Telephone System, whereas the oscillating sections 4y and 5y of the piezoelectric substrate 1y has a frequency response characteristic good for wide frequency band width as shown by B in FIG. 11 and is adapted to Personal Handyphone System (PHS).

Then, a portable telephone set comprising such a chip-type piezoelectric filter as a circuit component will be operated by means of a switching mechanism SW (selection switching means) to select either of the systems and activate either of the piezoelectric substrates 1x and 1y. Thus, a multi-functional filter is provided in a single portable telephone set and selectively used for either of the two systems. It should be noted that such a multi-applicability device may find a variety of applications other than the portable telephone set.

For the purpose of the invention, oscillating sections having frequency response characteristics different, from each other refer not only to those whose central frequencies are same but frequency bandwidths are different, but also to those whose central frequencies are different. According to the invention, such differences can be accommodated by differentiating the thicknesses and/or the degrees of polarization of the piezoelectric substrates.

Figure 10:
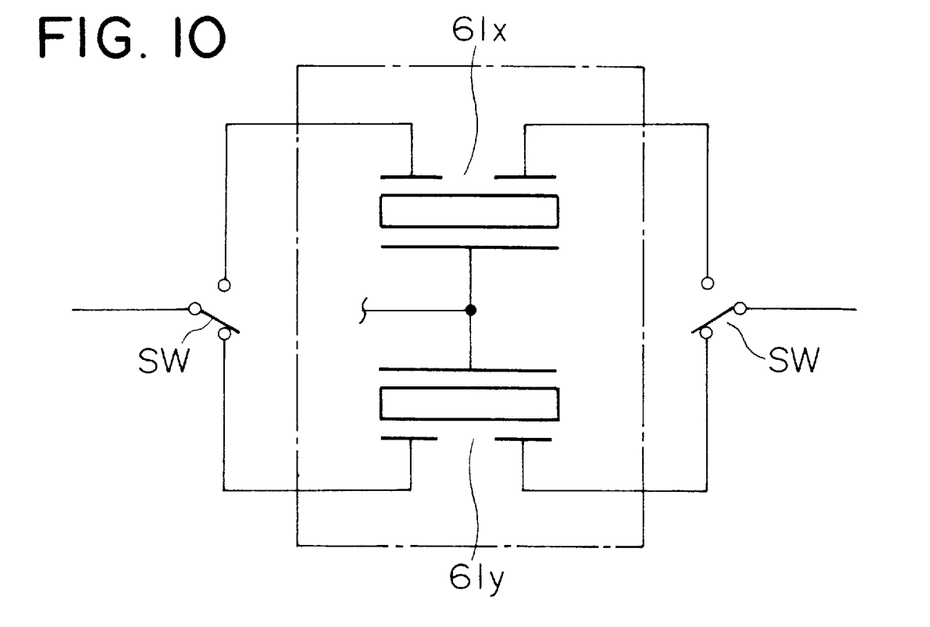
FIG. 10 is a schematic circuit diagram showing an equivalent circuit of a chip-type piezoelectric filter comprising a pair of piezoelectric substrates, each having a single oscillating section.

While the illustrated filter comprises two piezoelectric substrates 1x and 1y which are provided with a pair of oscillating sections 4x, 5x (4y, 5y) and a capacitor section 6x (6y) to which the oscillating sections are connected in parallel, alternatively, it is possible to use two or more piezoelectric substrates, each having a single oscillating section 61x (61y) so that one of the piezoelectric substrates is selected for use. FIG. 10 shows a circuit diagram of an equivalent circuit of such an arrangement.

While the above described embodiments represent a chip-type piezoelectric filter comprising a pair of piezoelectric substrates 1x and 1y, more than two piezoelectric substrates may be arranged to form a chip-type piezoelectric filter according to the invention such that they may be selectively used for operation. Then, any two adjacently located piezoelectric substrates are interposed by a spacer substrate and the multilayer structure of the piezoelectric substrates are sandwiched by a top cap substrate and a bottom cap substrate.

As described above in detail, the chip-type piezoelectric filter according to the invention comprises a multilayer structure having a plurality of piezoelectric substrate, each having one or more than one oscillating sections showing a frequency response characteristic different from that or those of any of the remaining piezoelectric substrate(s), each of the oscillating sections being provided with a plurality of pairs of input/output connection terminals, so that the oscillating sections may be selectively used to adapt the piezoelectric filter to different applications with different operating frequencies. Thus, the present invention provides a multi-functional piezoelectric filter adapted to a plurality of applications.

The chip-type piezoelectric filter according to the invention can be manufactured and assembled in a simple manner because it is produced by simply laying substrates one on the other. If the plurality of substrates are made to have same dimensions, they can be assembled squarely in a particularly simple way.

Additionally, when one or more than one spacer substrates are used and provided with windows to be arranged vis-a-vis the corresponding oscillating sections and the multilayer structure of piezoelectric substrates and one or more than one spacer substrates is sandwiched by top and bottom cap substrates having recesses also vis-a-vis the corresponding oscillating sections, then the oscillations of the oscillating sections are not obstructed and the electrically conductive layers on the surfaces of the piezoelectric substrates are protected by the cap substrates to make the piezoelectric filter operate stably and reliably.

We claim:

1. A chip-type piezoelectric filter having a multilayer structure comprising:

a plurality of piezoelectric substrates, each having at least one oscillating section showing a frequency response characteristic different from each other for the respective piezoelectric substrates, each of the oscillating sections having a pair of input/output electrodes arranged on one surface of the associated piezoelectric substrate and a common electrode arranged on the other surface of the piezoelectric substrate, said oscillating sections being adapted to be selectively operated;

a plurality of pairs of input/output connection terminals provided on an outer peripheral surface of the multilayer structure, each pair of the input/output connection terminals being connected to the respective oscillating section; and a common connection terminal provided on the outer peripheral surface of the multilayer structure and connected to the common electrodes of the oscillating sections.

2. A chip-type piezoelectric filter as claimed in claim 1, wherein each of the piezoelectric substrates includes semi-circular or quadrant notches at positions thereof where the input/output connection terminals and common connection terminal are to be disposed, each of the notches is provided with a conductive layer for the respective connection terminal.

3. A chip-type piezoelectric filter as claimed in claim 1, wherein the respective connection terminals are provided with connector pins.

4. A chip-type piezoelectric filter as claimed in claim 1, wherein each of the piezoelectric substrates has two oscillating sections, one electrodes of the two pairs of input/output electrodes are connected to each other by an internal electric conduction pattern, the other electrodes of the two pairs of input/output electrodes extend to an outer peripheral surface of the respective piezoelectric substrate and are connected to the respective input/output connection terminals, and the common electrodes of the oscillating sections are respectively positioned vis-a-vis the respective paired input/output electrodes and are connected to each other by another internal electric conduction pattern.

5. A chip-type piezoelectric filter as claimed in claim 4, wherein the internal electric conduction patterns are arranged to form a capacitor section.

6. A chip-type piezoelectric filter as claimed in claim 1, wherein a spacer substrate is disposed between any two adjacent piezoelectric substrates, each spacer substrate includes at least one opening each provided vis-a-vis the corresponding oscillating section, a pair of cap substrates are arranged respectively on the upper piezoelectric substrate and the lower piezoelectric substrate, each cap substrate includes at least one recess each positioned vis-a-vis the corresponding oscillating section, and all the substrates have same dimensions.

7. A filter circuit having a piezoelectric filter as claimed in claim 1, wherein a selection/switching means is provided to selectively connect the paired input/output connection terminals connected to the oscillating section(s) of only one of the piezoelectric substrates and arranged on the outer peripheral surface of the multilayer structure to a given electric path in order to select only the oscillating section(s) of the piezoelectric substrate.

8. A chip-type piezoelectric filter having a multilayer structure comprising:

first and second piezoelectric substrates, each having at least one oscillating sections each showing a frequency response characteristic different from that or those of any of the other piezoelectric substrate, each of the oscillating sections in the first and second piezoelectric substrates having a pair of input/output electrodes arranged on one surface of each of the first and second piezoelectric substrates and a common electrode arranged on the other surface of the piezoelectric substrate;

a spacer substrate disposed between the first and second piezoelectric substrates and having at least one opening each located vis-a-vis the corresponding oscillating section;

a pair of cap substrates arranged respectively on the first and second piezoelectric substrates, each having at least one recess each of which is located vis-a-vis the corresponding oscillating section;

a first pair of input/output connection terminals provided on an outer peripheral surface of the multilayer structure and connected to the respective input/output electrodes on the first piezoelectric substrate;

a second pair of input/output connection terminals provided on an outer peripheral surface of the multilayer structure and connected to the respective input/output electrodes on the second piezoelectric substrate;

said first and second piezoelectric substrates being adapted to be selectively operated by way of the first and second paired input/output connection terminals, and a common connection terminal provided on the outer peripheral surface of the multilayer structure and connected to the common electrodes on the first and second piezoelectric substrates.

9. A chip-type piezoelectric filter as claimed in claim 8, wherein the respective connection terminals are provided with connector pins.

10. A chip-type piezoelectric filter as claimed in claim 8, wherein each of the piezoelectric substrates has two oscillating sections, one electrodes of the two pairs of input/output electrodes are connected to each other by an internal electric conduction pattern, the other electrodes of the two pairs of input/output electrodes extend to an outer peripheral surface of the respective piezoelectric substrate and are connected to the respective input/output connection terminals, and the common electrodes of the oscillating sections are respectively positioned vis-a-vis the respective paired input/output electrodes and are connected to each other by another internal electric conduction pattern.

11. A chip-type piezoelectric filter as claimed in claim 8, wherein each of the piezoelectric substrates includes semi-circular or quadrant notches at positions thereof where the input/output connection terminals and common connection terminal are to be disposed, each of the notches is provided with a conductive layer for the respective connection terminal.

12. A filter circuit having a piezoelectric filter as claimed in claim 8, wherein a selection/switching means is provided to selectively connect the paired input/output connection terminals connected to the oscillating section(s) of only one of the first and second piezoelectric substrates and arranged on the outer peripheral surface of the multilayer structure to a given electric path in order to select only the oscillating section(s) of the first or second piezoelectric substrate.

* * * * *